(12) United States Patent
Tokunaga et al.

(10) Patent No.: US 9,443,611 B2
(45) Date of Patent: Sep. 13, 2016

(54) SEMICONDUCTOR INTEGRATED CIRCUIT WITH BIST CIRCUIT

(71) Applicant: Kabushiki Kaisha Toshiba, Minato-ku, Tokyo (JP)

(72) Inventors: Chikako Tokunaga, Kanagawa-ken (JP); Kenichi Anzou, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 547 days.

(21) Appl. No.: 13/942,095

(22) Filed: Jul. 15, 2013

(65) Prior Publication Data

US 2014/0245087 A1    Aug. 28, 2014

(30) Foreign Application Priority Data

Feb. 26, 2013 (JP) ................................ P2013-035843

(51) Int. Cl.
*G11C 29/00* (2006.01)
*G11C 29/12* (2006.01)
(Continued)

(52) U.S. Cl.
CPC ............... *G11C 29/12* (2013.01); *G11C 29/02* (2013.01); *G11C 29/18* (2013.01); *G11C 29/40* (2013.01); *G11C 29/44* (2013.01); *G11C 2029/0405* (2013.01); *G11C 2029/3602* (2013.01)

(58) Field of Classification Search
CPC ............ B41J 2/155; B41J 2/175; B41J 2/21; B41J 29/38; G11C 29/50; G11C 2029/0405; G11C 2029/3602; G11C 29/00; G11C 29/02; G11C 29/12; G11C 29/18; G11C 29/40; G11C 29/44; G11C 29/48; G11C 29/56; G01R 31/3177; G06F 11/00

USPC ..................................... 714/718, 738
See application file for complete search history.

(56) References Cited

U.S. PATENT DOCUMENTS

| 5,574,733 A | * | 11/1996 | Kim ............... G01R 31/318335 714/728 |
| 6,333,706 B1 | * | 12/2001 | Cummings ............ H03M 1/108 341/120 |
| 7,249,295 B2 | | 7/2007 | Fukuyama et al. |
| 8,037,376 B2 | | 10/2011 | Anzou et al. |

(Continued)

FOREIGN PATENT DOCUMENTS

| JP | S59-120965 A | 7/1984 |
| JP | 2001-042008 A | 2/2001 |

(Continued)

OTHER PUBLICATIONS

Japanese Office Action issued in Japanese Patent Application No. 2013-035843 dated Jul. 24, 2015, with English Translation.

*Primary Examiner* — Albert Decady
*Assistant Examiner* — Enamul M Kabir
(74) *Attorney, Agent, or Firm* — White & Case LLP (57) ABSTRACT

According to an embodiment, a semiconductor integrated circuit includes a memory, a bypass circuit, a first selection unit, a compression unit, and a comparison unit. The bypass circuit bypasses the test signal to output a bypass signal. When the memory is tested using a BIST circuit, the first selection unit selects a memory signal output from the memory in response to the test signal. When the BIST circuit is tested, the first selection unit selects the bypass signal. If the memory is tested, the compression unit holds a signal output from the first selection unit and if the BIST circuit is tested, the compression unit compresses and holds the signal output from the first selection unit. The comparison unit compares the signal held in the compression unit with an expectation value signal of the memory signal which is generated in the BIST circuit.

14 Claims, 6 Drawing Sheets

(51) Int. Cl.
*G11C 29/02* (2006.01)
*G11C 29/18* (2006.01)
*G11C 29/40* (2006.01)
*G11C 29/44* (2006.01)
*G11C 29/04* (2006.01)
*G11C 29/36* (2006.01)

(56) References Cited

U.S. PATENT DOCUMENTS

| | | |
|---|---|---|
| 8,201,037 B2 | 6/2012 | Anzou et al. |
| 2003/0200492 A1* | 10/2003 | Nakao ............ G01R 31/318547 714/724 |
| 2005/0204239 A1* | 9/2005 | Miyaji ................... G11C 29/36 714/738 |
| 2007/0079052 A1* | 4/2007 | Hasegawa ............. G11C 29/54 711/100 |
| 2009/0063917 A1* | 3/2009 | Tokunaga .............. G11C 29/44 714/719 |
| 2009/0089632 A1* | 4/2009 | Morein ................... G11C 29/14 714/720 |

FOREIGN PATENT DOCUMENTS

| | | |
|---|---|---|
| JP | 2002-107425 | 4/2002 |
| JP | 2007-333495 A | 12/2007 |
| JP | 2009-245553 A | 10/2009 |

* cited by examiner

SEMICONDUCTOR INTEGRATED CIRCUIT WITH BIST CIRCUIT

CROSS REFERENCE TO RELATED APPLICATION

This application is based upon and claims the benefit of priority from the prior Japanese Patent Application No. 2013-035843, filed on Feb. 26, 2013, the entire contents of which are incorporated.

FIELD

Embodiments described herein relate to a semiconductor integrated circuit with a BIST circuit.

BACKGROUND

A built-in self test circuit (hereinafter, referred to as a BIST circuit) is built in a memory, which is built in a semiconductor integrated circuit apparatus, to detect a failure of a memory during a manufacturing test. However, it is difficult to precisely detect the failure of the memory when there is a failure in the BIST circuit. Therefore, it is required to test an operation of the BIST circuit. When a new circuit is built in the semiconductor integrated circuit apparatus to test the BIST circuit, a size of the circuit is disadvantageously increased.

DETAILED DESCRIPTION

According to an embodiment, a semiconductor integrated circuit includes a memory, a bypass circuit, a first selection unit, a compression unit, and a comparison unit. A test signal which is generated in a BIST circuit is input to the memory. The bypass circuit bypasses the test signal to output a bypass signal. When the memory is tested using the BIST circuit, the first selection unit selects a memory signal output from the memory in response to the test signal. When the BIST circuit is tested, the first selection unit selects the bypass signal. If the memory is tested, the compression unit holds a signal output from the first selection unit and if the BIST circuit is tested, the compression unit compresses and holds the signal output from the first selection unit. The comparison unit compares the signal held in the compression unit with an expectation value signal of the memory signal which is generated in the BIST circuit.

Hereinafter, a plurality of embodiments will be described with reference to the drawings. In the drawings, the same reference numerals denote the same or similar parts.

Figure 1:
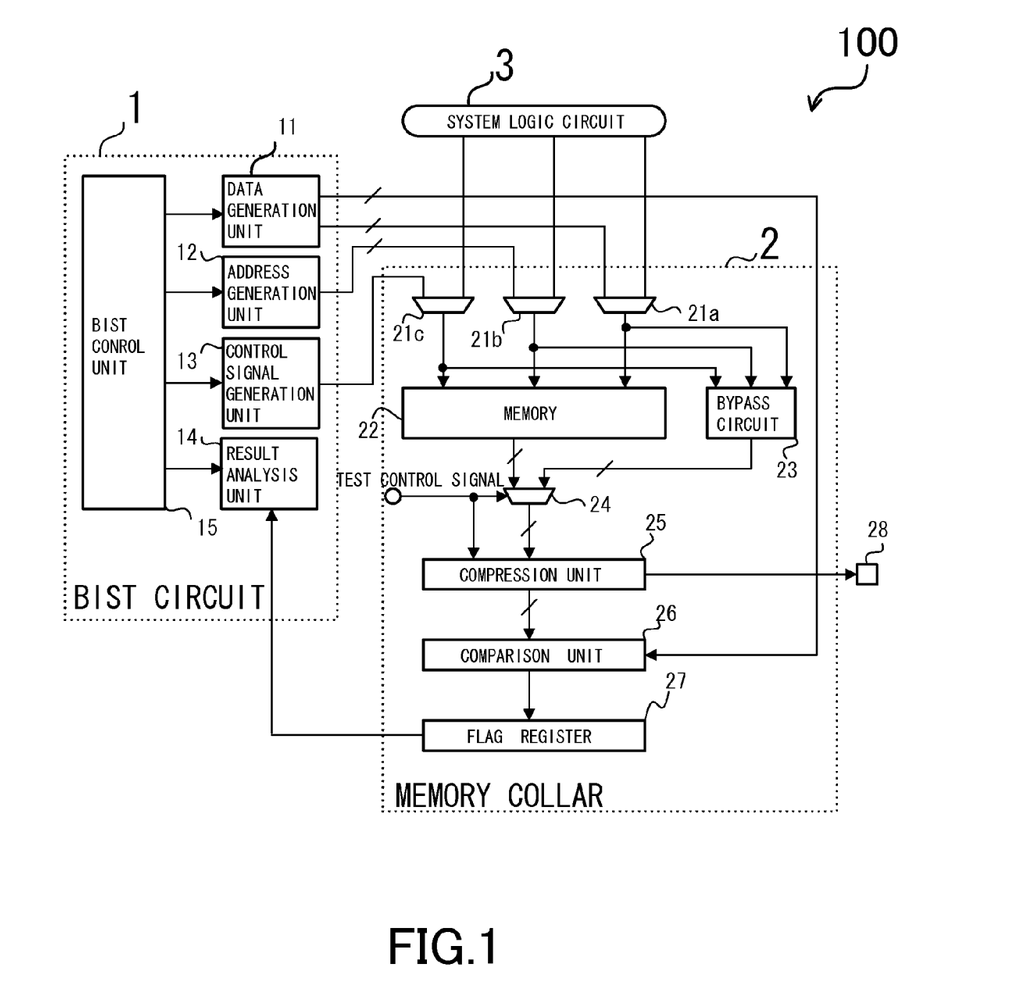
FIG. 1 is a block diagram illustrating a schematic configuration of a semiconductor integrated circuit apparatus according to a first embodiment.

A semiconductor integrated circuit which includes a BIST protection circuit according to a first embodiment will be described with reference to the drawings. FIG. 1 is a block diagram illustrating a schematic configuration of the semiconductor integrated circuit apparatus according to the first embodiment.

As illustrated in FIG. 1, a semiconductor integrated circuit apparatus 100 includes a BIST circuit 1, a memory collar 2 having a memory 22, and a system logic circuit 3. The semiconductor integrated circuit apparatus 100 has a function of testing the memory 22 and a function of testing the BIST circuit 1.

The BIST circuit 1 is a circuit which is applied to test the memory 22. The BIST circuit 1 includes a data generation unit 11, an address generation unit 12, a control signal generation unit 13, a result analysis unit 14, and a BIST control unit 15.

The data generation unit 11 generates a data signal (a first data signal) and an expectation value signal. The data signal is a digital signal which is formed of a plurality of bits and indicates data which is written in the memory 22. The expectation value signal is a digital signal which is formed of a plurality of bits and indicates an expectation value of a signal which is output from the memory 22 at the time of testing the memory 22.

The address generation unit 12 generates an address signal (first address signal). The address signal designates an address in which data is written or read in the memory 22.

The control signal generation unit 13 generates various control signals (first control signal). The control signal is a write enable signal which controls a writing operation to the memory 22 and a read enable signal which controls a reading operation, for example.

The result analysis unit 14 determines whether there is a failure in the memory 22, based on a flag signal which is output from the memory collar 2.

The BIST control unit 15 controls the data generation unit 11, the address generation unit 12, the control signal generation unit 13, and the result analysis unit 14 and generates a test control signal to test the memory 22 or the BIST circuit 1. The test control signal is a signal which is used to test any one of the memory 22 and the BIST circuit 1 and is used in the memory collar 2.

Further, hereinafter, the data signal, the address signal, and the control signal, which is generated by the BIST circuit 1 to test the memory 22 or the BIST circuit 1, are collectively referred as test signals.

The memory collar 2 includes a multiplexer 21a (a third selection unit), a multiplexer 21b (a fourth selection unit), a multiplexer 21c (a fifth selection unit), the memory 22, the bypass circuit 23, a multiplexer 24 (a first selection unit), a compression unit 25, a comparison unit 26, and a flag register 27 (a flag generating unit).

The multiplexers 21a to 21c select any one of a signal output from the BIST circuit 1 and a signal output from the system logic circuit 3 in response to the control of the BIST control unit 15. Specifically, during a normal operation when the system logic circuit 3 operates, the multiplexer 21a selects a data signal (a second data signal) from the system logic circuit 3, the multiplexer 21b selects an address signal (a second address signal) from the system logic circuit 3, and the multiplexer 21c selects a control signal (a second control signal) from the system logic circuit 3. When the memory 22 is tested, the multiplexer 21a selects a data signal from the BIST circuit 1, the multiplexer 21b selects an address signal from the BIST circuit 1, and the multiplexer 21c selects a control signal from the BIST circuit 1. The selected signal is supplied to the memory 22 and the bypass circuit 23.

The memory 22 is an SRAM (static random access memory), for example, and has a predetermined number of addresses and stores a predetermined bit value in each the address. For example, the memory 22 has 5 bit (0 to 31) addresses and 128 bit values are stored in each address.

The data signal, the address signal, and the control signal, which are selected by the multiplexers 21a to 21c, respectively, are input to the memory 22. In response to the control signal, a value indicated by the data signal is written in an address designated by the address signal and a value which is stored in the address designated by the address signal is read out. The read-out value is supplied to the multiplexer 24.

The bypass circuit 23 allows the data signal, the address signal, and the control signal which are selected by the multiplexers 21a to 21c, respectively, to be bypassed without passing through the memory 22 and supplies the signals to the multiplexer 24 as bypass signals.

Here, the data signal, the address signal, and the control signals are input to the memory 22 and the bypass circuit 23, while only the data signal is output from the memory 22. Therefore, a total bit number of a signal which is output from the memory 22 is smaller than a total bit number of the signals which are input to the memory 22 and the bypass circuit 23.

The bypass circuit 23 may appropriately convert the input data signal, address signal, and the control signal so as to match the bit number of the data signal. For example, the bypass circuit 23 performs an exclusive OR operation on bits of a portion of the data signal, the address signal, and the control signal in order to make a plurality of bits become one bit so as to reduce the bit number.

The test control signal is input from the BIST control unit 15 to the multiplexer 24. When the memory 22 is tested, in response to the test control signal, the multiplexer 24 selects a signal output from the memory 22 (hereinafter, simply referred to as a "memory signal"). When the BIST circuit 1 is tested, the multiplexer 24 selects a test signal which is bypassed by the bypass circuit 23 (hereinafter, simply referred to as a "bypass signal").

The compression unit 25 has a flip-flop and holds the signal output from the multiplexer 24. The held signal is used for the comparison processing in the comparison unit 26. The compression unit 25 uses the flip-flop to compress the signal output from the multiplexer 24. A compressed signal is output from an output terminal 28 of the semiconductor integrated circuit apparatus 100 to the outside.

Specifically, when the memory 22 is tested, the compression unit 25 holds the memory signal output from the multiplexer 24. When the BIST circuit 1 is tested, the compression unit 25 compresses the bypass signal output from the multiplexer 24. One of the advantages of the embodiment is that the flip-flop of the compression unit 25 is used to test the memory 22 and the BIST circuit 1. An example of the internal configuration of the compression unit 25 will be described below with reference to FIG. 4.

The comparison unit 26 compares whether the memory signal held in the flip-flop of the compression unit 25 matches with an expectation value signal generated by the data generation unit 11 of the BIST circuit 1.

The flag register 27 generates a flag signal indicating whether the memory signal matches with the expectation value signal and holds the flag signal. The flag signal is a 1 bit digital signal and is set to a value of "0" when both signals match each other as a result of the comparison by the comparison unit 26. The flag signal is set to a value of "1" when at least portions of the memory signal and the expectation value signal do not match. The flag signal is input to the result analysis unit 14 of the BIST circuit 1 and the result analysis unit 14 determines whether there is a failure in the memory 22.

Figure 2:
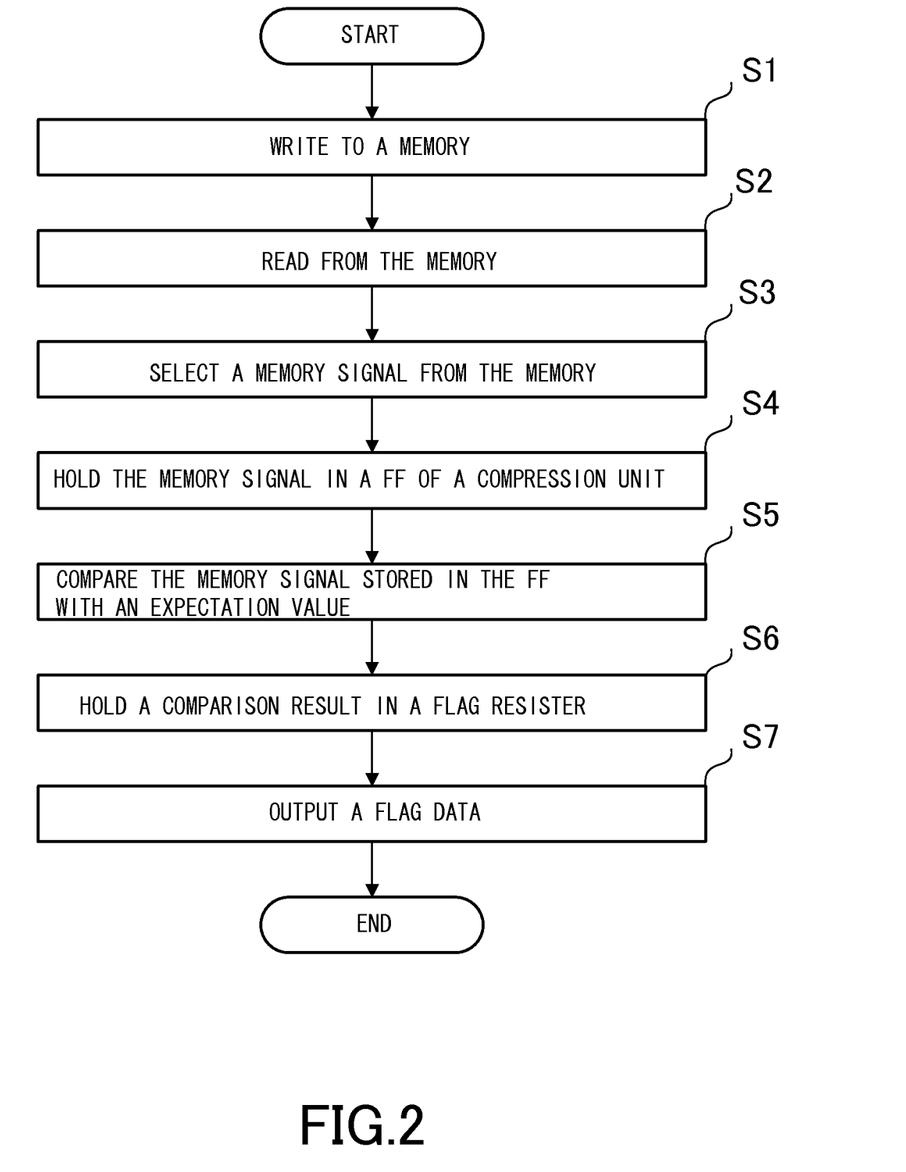
FIG. 2 is a flowchart illustrating an example of an operation of the semiconductor integrated circuit apparatus when a memory according to the first embodiment is tested.

FIG. 2 is a flowchart illustrating an example of an operation of the semiconductor integrated circuit apparatus 100 when the memory 22 is tested.

As illustrated in FIG. 2, first, in accordance with the control of the BIST control unit 15, the data generation unit 11 generates the data signal, the address generation unit 12 generates the address signal, and the control signal generation unit 13 generates the write enable signal. As a result, a value indicated by the data signal is written in an address designated by the address signal in the memory 22 (step S1). Further, data may be written in a plurality of addresses of the memory 22 as necessary.

Next, in accordance with the control of the BIST control unit 15, the address generation unit 12 generates the address signal and the control signal generation unit 13 generates the read enable signal. As a result, the value stored in the address designated by the address signal is read out in the memory 22 (step S2). When the memory 22 is tested, in response to the test control signal, the multiplexer 24 selects the memory signal output from the memory 22 (step S3).

The memory signal selected by the multiplexer 24 is held in the flip-flop of the compression unit 25 (step S4). Further, the comparison unit 26 compares the memory signal held in the flop-flop with the expectation value signal generated by the data generation unit 11 (step S5). The comparison result is held in the flag register 27 as a flag signal (step S6). The flag signal is supplied to the result analysis unit 14 (step S7). The result analysis unit 14 determines whether there is a failure in the memory 22 based on the flag signal.

Figure 3:
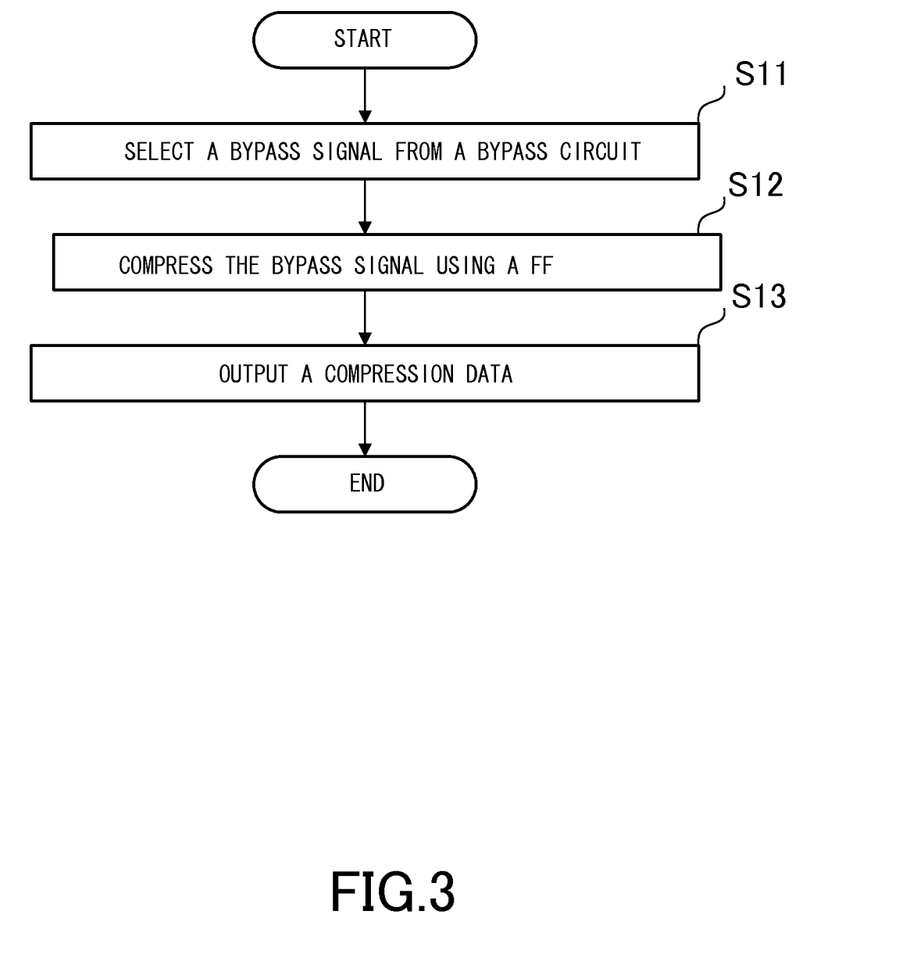
FIG. 3 is a flowchart illustrating an example of an operation of the semiconductor integrated circuit apparatus when a BIST circuit according to the first embodiment is tested.

FIG. 3 is a flowchart illustrating an example of an operation of the semiconductor integrated circuit apparatus 100 when the BIST circuit 1 is tested.

As illustrated in FIG. 3, in accordance with the control of the BIST control unit 15, the data generation unit 11 generates any data signal, the address generation unit 12 generates any address signal, and the control signal generation unit 13 generates any control signal. When the BIST circuit 1 is tested, in response to the test control signal, the multiplexer 24 selects the bypass signal output from the bypass circuit 23 (step S11). As described above, the data signal, the address signal, and the control signal generated by the BIST circuit 1 are input to the bypass circuit 23 without passing through the memory 22. The bypass signal is a signal obtained such that the bit numbers of the data signal, the address signal, and the control signal are converted in accordance with the output bit number of the memory 22.

The bypass signal selected by the multiplexer 24 is compressed using the flip-flop of the compression unit 25 (step S12). A compressed bypass signal is output from the output terminal 28 of the semiconductor integrated circuit apparatus 100 to the outside (step S13). The compressed bypass signal is compared with the expectation value which is generated in advance by a tester, or the like, to determine whether there is a failure in the BIST circuit 1.

As described above, the flip-flop of the compression unit 25 may be used to test the memory 22 and the BIST circuit 1. Since the flop-flop is commonly used for both tests, it is possible to suppress the increase in a size of the circuit of the semiconductor integrated circuit apparatus 100. Hereinafter, an example of a specific configuration of the compression unit 25 will be described.

Figure 4:
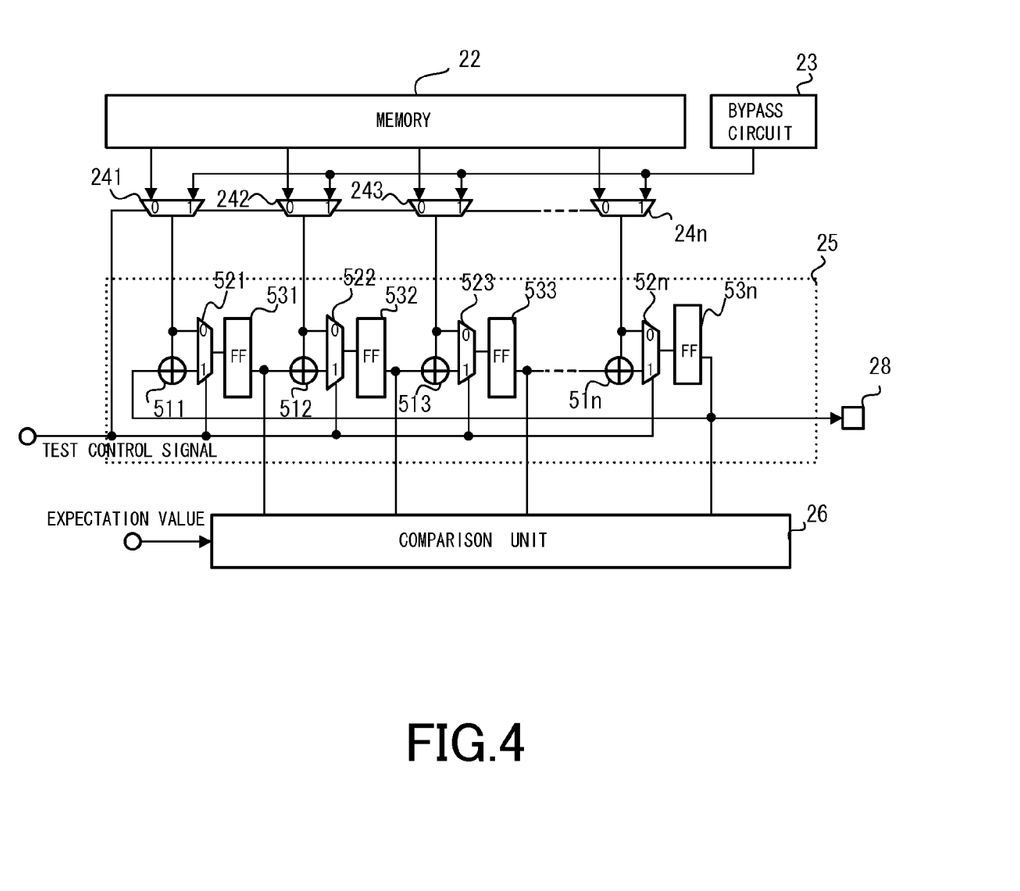
FIG. 4 is a block diagram illustrating an internal configuration of a compression unit according to the first embodiment and a peripheral circuit of the compression unit in detail.

FIG. 4 is a block diagram illustrating an internal configuration of the compression unit 25 and a peripheral circuit of the compression unit 25 in detail. As illustrated in FIG. 4, a signal output from the memory 22 has a n bits (n is an integer of 2 or larger), a signal output from the bypass circuit 23 has a n bits. Multiplexers 241 to 24n to which first to n-th bits of the memory signal and first to n-th bits of the bypass signal are input are provided. The multiplexers 241 to 24n select any one of the signals in response to the test control signal.

In the embodiment, the test control signal is set to a value of "0" when the memory 22 is tested and the test control signal is set to a value of "1" when the BIST circuit 1 is tested. Further, the multiplexers 241 to 24n select the memory signal when the test control signal has a value of "0" and select the bypass signal when the test control signal has a value of "1".

The compression unit 25 includes exclusive OR circuits 511 to 51n, multiplexers 521 to 52n (second selection units), and flip-flops 531 to 53n. Here, even though the flip-flops 531 to 53n are used in the compression unit 25, a register may be used instead of the flip-flop.

The exclusive OR circuit 512, the multiplexer 522, and the flip-flop 532, which are provided so as to correspond to the multiplexer 242, will be described as an example. The exclusive OR circuit 512 generates an exclusive OR of a value of a signal output from the multiplexer 242 and a value which is held in the flip-flop 531. The signal output from the multiplexer 242 and the signal output from the exclusive OR circuit 512 are input to the multiplexer 522. When the test control signal has a value of "0", the multiplexer 522 selects the former. When the test control signal has a value of "1", the multiplexer 522 selects the latter. The flip-flop 532 holds the output signal of the multiplexer 522.

The configurations of the exclusive OR circuit 513 to 51n, the multiplexers 523 to 52n, and the flip-flops 533 to 53n are similar thereto. The exclusive OR circuit 511, the multiplexer 521, and the flip-flop 531 is similar except that the value held in the flip-flop 53n is input to the exclusive OR circuit 511.

The values held in the flip-flops 531 to 53n are supplied to the comparison unit 26 and compared with the expectation value which is generated by the data generation unit 11. The value held in the flip-flop 53n is output to the outside of the semiconductor integrated circuit apparatus 100.

When the memory 22 is tested, that is, when the test control signal is set to a value of "0", the operation of the compression unit 25 is as follows. In response to the test signal from the BIST circuit 1, each bit of the memory signal output from the memory 22 is supplied to the flip-flops 531 to 53n via the multiplexers 241 to 24n and the multiplexers 521 to 52n.

The test signal includes a plurality of test patterns in time series. When the test pattern is switched, the memory signal output from the memory 22 is changed. At a timing when the memory signal is changed, the values held in the flip-flops 531 to 53n are updated and output to the comparison unit 26.

The comparison unit 26 compares the values with the expectation value and determines whether there is a failure in the memory 22.

Meanwhile, when the BIST circuit 1 is tested, that is, when the test control signal is set to a value of "1", the operation of the compression unit 25 is as follows. The values held in the flip-flops 531 to 53n are initialized to be a value of "0", for example.

Bits of the bypass signal output from the bypass circuit 23 are input to the exclusive OR circuits 511 to 51n via the multiplexers 241 to 24n, respectively. An exclusive OR circuit 51m (m is an integer of 2 or larger and n or smaller) generates an exclusive OR of a value held in a flip-flop 53(m−1) at a prior stage and the output value of a multiplexer 24m. The generated value is supplied to a flip-flop 53m at a subsequent stage via a multiplexer 52m. The exclusive OR circuit 511 generates the exclusive OR of the value held in the flip-flop 53n and the output value of the multiplexer 241. The generated value is supplied to the flip-flop 531 via the multiplexer 521.

When the BIST circuit 1 is tested, and the test pattern is switched, the bypass signal from the bypass circuit 23 is changed. At a timing when the bypass signal is changed, the values held in the flip-flops 531 to 53n are updated. As described above, whenever the bypass signal is changed, the exclusive OR of the values held in the flip-flops 531 to 53n and the value of each bit of the bypass signal is generated. As a result, the bypass signals corresponding to a plurality of test patterns may be compressed into one signal.

At a timing when the bypass signal is changed, the value held in the flip-flop 53n is output to the outside of the semiconductor integrated circuit apparatus 100. In order to determine whether there is a failure in the BIST circuit 1, the value output from the flip-flop 53n and the expectation value which is generated in advance are compared by a semiconductor tester, or the like. By performing the compression processing, even when an operation frequency of the BIST circuit 1 is higher than a signal output frequency from the semiconductor integrated circuit apparatus 100, the test may be performed at the operation frequency of the BIST circuit 1.

The compression unit 25 includes the flip-flops 531 to 53n which are used to test the memory 22, the exclusive OR circuits 511 to 51n, and the flip-flops 531 to 53n. Thus, the semiconductor integrated circuit apparatus 100 may test the BIST circuit 1 only by adding a small number of circuits to the circuit to test the memory 22.

Furthermore, the configuration of the compression unit 25 illustrated in FIG. 4 is for illustrative purpose only and various modifications may be allowed. For example, at least a portion of the exclusive OR circuits 512 to 51n may be a three-input exclusive OR circuit to which the value held in the flip-flop 53n is further input. In addition, instead of the exclusive OR circuit, a logical circuit which performs a separate logical operation may be used.

As described above, according to the first embodiment, any one of the memory signal from the memory 22 and the bypass signal from the bypass circuit 23 is input to the compression unit 25. The register of the compression unit 25 is used to test the memory 22 and the BIST circuit 1. Therefore, the BIST circuit 1 may be tested while suppressing the increase in a size of the circuit.

A semiconductor integrated circuit which includes a BIST protection circuit according to a second embodiment will be described with reference to the drawings. In the second embodiment, when the memory 22 is tested, the comparison unit 26 and the flag register 27 are also tested together.

Figure 5:
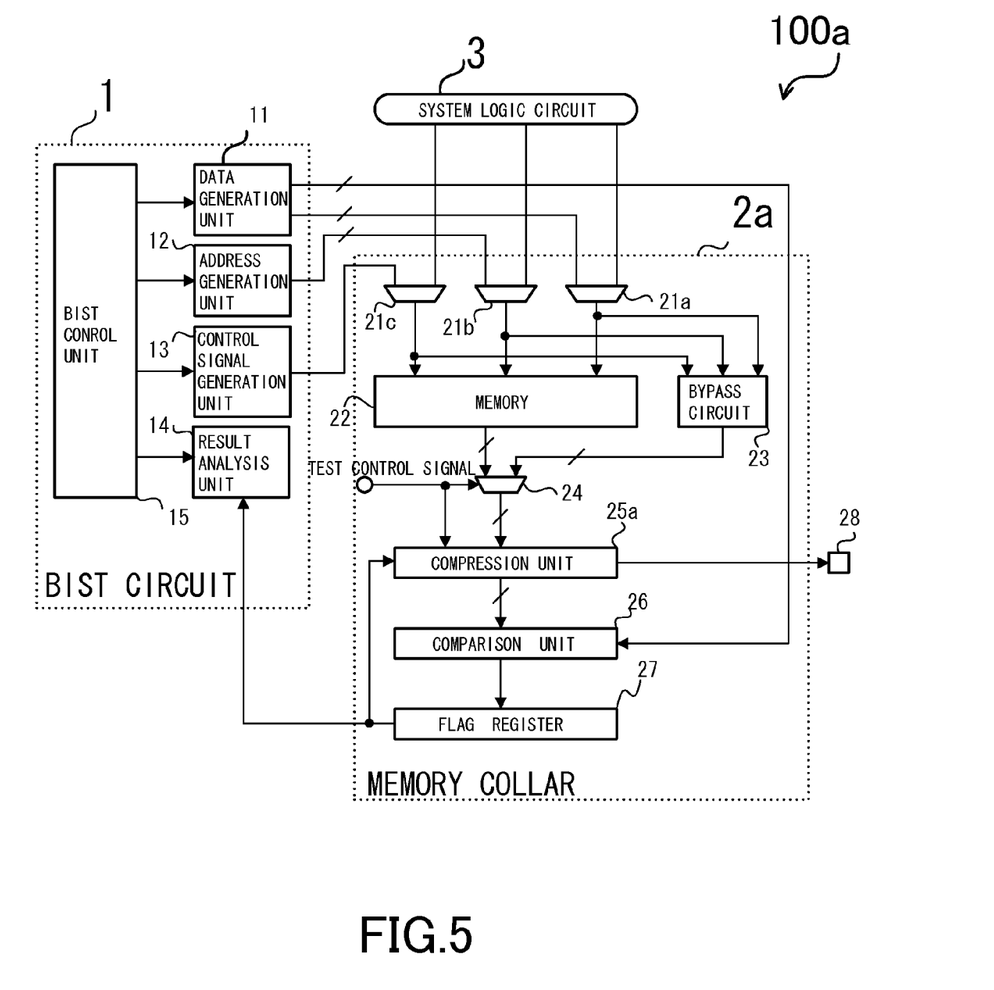
FIG. 5 is a block diagram illustrating a schematic configuration of a semiconductor integrated circuit apparatus according to a second embodiment.

FIG. 5 is a block diagram illustrating a schematic configuration of the semiconductor integrated circuit apparatus according to the second embodiment. In FIG. 5, the same reference numerals are denoted to the components which are common to those of FIG. 1 and the difference will be mainly described below. As illustrated in FIG. 5, a semiconductor integrated circuit apparatus 100a includes a BIST circuit 1, a memory collar 2a having a memory 22, and a system logic circuit 3. In the semiconductor integrated circuit apparatus 100a, the flag signal output from the flag register 27 is input to a compression unit 25a and a result analysis unit 14.

A value of the flag signal is set in response to the comparison result by the comparison unit 26. Therefore, if there is a failure in the comparison unit 26 or the flag register 27, the value of the flag signal is set to a value which is different from an expectation value. Accordingly, it is possible to detect the failure of the comparison unit 26 and the flag register 27 based on the flag signal.

Figure 6:
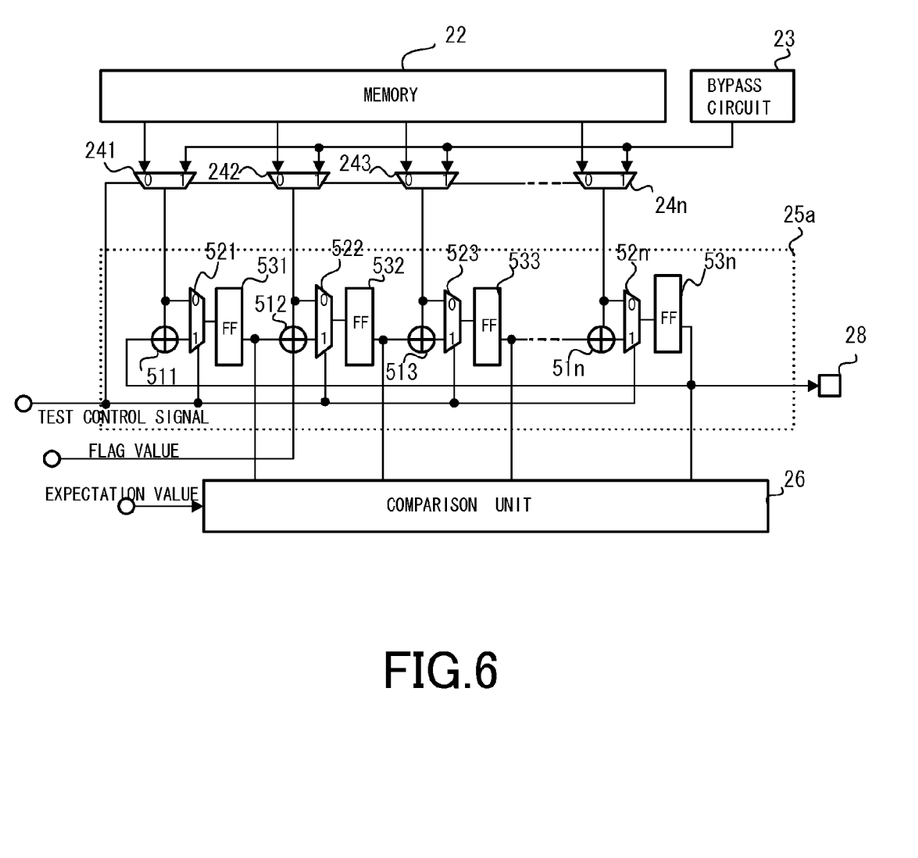
FIG. 6 is a block diagram illustrating an internal configuration of a compression unit according to the second embodiment and a peripheral circuit of the compression unit in detail.

FIG. 6 is a block diagram illustrating an internal configuration of the compression unit 25a and a peripheral circuit of the compression unit 25a in detail. The difference from FIG. 4 is that the flag signal is input to an exclusive OR circuit. In FIG. 6, an example that the flag signal is input to the exclusive OR circuit 512 is illustrated. However, the flag signal may be input to another exclusive OR circuit or a plurality of exclusive OR circuits. By the above configuration, it is possible to compress the bypass signal and the flag signal.

As described above, according to the second embodiment, the flag signal from the flag register 27 is input to the compression unit 25a. Therefore, it is possible to detect the failure of the comparison unit 26 and the flag register 27.

Furthermore, in the first embodiment (FIG. 1) and the second embodiment (FIG. 5), the BIST circuit and the memory collar are provided in one semiconductor integrated circuit apparatus, but the embodiment are not limited thereto. The BIST circuit and the memory collar may be provided in separate semiconductor integrated circuit apparatuses.

While certain embodiments have been described, these embodiments have been presented by way of example only, and are not intend to limit the scope of the inventions. Indeed, the novel embodiments described herein may be embodied in a variety of the other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor integrated circuit, comprising:
a memory configured to receive a test signal, which is used for a test of the memory, generated in a BIST (built-in self test) circuit;
a bypass circuit configured to bypass the test signal to output a bypass signal;
a first selection unit configured to select a memory signal output from the memory in response to the test signal when the memory is tested using the BIST circuit, the first selection unit being configured to select the bypass signal when the BIST circuit is tested;
a compression unit configured to hold a signal output from the first selection unit when the memory is tested, the compression unit being configured to compress and hold the signal output from the first selection unit when the BIST circuit is tested; and
a comparison unit configured to compare a signal held in the compression unit with an expectation value signal of the memory signal generated in the BIST circuit.

2. The semiconductor integrated circuit according to claim 1, wherein
the first selection unit selects to test the memory or to test the BIST circuit based on a test control signal and
the compression unit holds a signal output from the first selection unit or compresses and holds the signal based on the test control signal.

3. The semiconductor integrated circuit according to claim 1, wherein the first selection circuit is a multiplexer.

4. The semiconductor integrated circuit according to claim 1, wherein
the signal output from the first selection unit is a digital signal formed of a plurality of bits and
the compression unit includes:
a plurality of flip-flops, each of the plurality of flip-flops configured to latch a value of each of the plurality of bits of the signal output from the first selection unit;
a logical circuit configured to be provided between the two adjacent flip-flops and performs a logical operation for performing a compression processing between a value held in a flip-flop at a prior stage and a value of a bit of a signal output from the first selection unit corresponding to a flip-flop at a subsequent stage; and
a second selection unit configured to, when the memory is tested, supply the value of the bit of the signal output from the first selection unit corresponding to the flip-flop at the subsequent stage to the flip-flop at the subsequent stage, the second selection unit being configured to, when the BIST circuit is tested, supply an output value of the logical circuit to the flip-flop at the subsequent stage.

5. The semiconductor integrated circuit according to claim 4, wherein the logical circuit is an exclusive OR circuit.

6. The semiconductor integrated circuit according to claim 4, wherein the second selection circuit is a multiplexer.

7. The semiconductor integrated circuit according to claim 1, further comprising:
an output terminal configured to output a bypass signal compressed by the compression unit to determine whether there is a failure in the BIST circuit.

8. The semiconductor integrated circuit according to claim 1, further comprising:
a flag generating unit configured to generate a flag signal indicating whether a signal held in the compression unit matches with the expectation value signal, based on the comparison result by the comparison unit.

9. The semiconductor integrated circuit according to claim 8, wherein the flag signal is output to the BIST circuit.

10. The semiconductor integrated circuit according to claim 8, wherein the flag signal is output to the BIST circuit and the compression unit.

11. The semiconductor integrated circuit according to claim 8, wherein the flag generating unit is a flag register.

12. The semiconductor integrated circuit according to claim 1, wherein the test signal includes at least one of an address signal which designates an address of the memory, a data signal written in the memory, and a control signal which controls writing and reading of the memory.

13. The semiconductor integrated circuit according to claim 8, wherein
the BIST circuit includes:
a BIST control unit configured to control the memory and the BIST circuit;
a data generation unit configured to generate a first data signal and the expectation value signal;
an address generation unit configured to generate a first address signal;
a control signal generation unit configured to generate a first control signal; and
a result analysis unit configured to determine whether there is a failure in the memory based on the flag signal.

14. The semiconductor integrated circuit according to claim 1, wherein the memory is an SRAM.

* * * * *